US010523233B1

(12) United States Patent
Stagg et al.

(10) Patent No.: US 10,523,233 B1
(45) Date of Patent: Dec. 31, 2019

(54) MEMBRANE DIGITAL ANALOG SWITCHES

(71) Applicant: Cattron Holdings, Inc., Warren, OH (US)

(72) Inventors: David Stagg, Flat Rock, NC (US); Thomas Hornung, Warren, OH (US); Ryan Wooten, Strongsville, OH (US)

( * ) Notice: Subject to any disclaimer, the term of this patent is extended or adjusted under 35 U.S.C. 154(b) by 0 days.

(21) Appl. No.: 16/396,049

(22) Filed: Apr. 26, 2019

(51) Int. Cl.
*H03M 11/00* (2006.01)
*H03M 1/74* (2006.01)
*G01L 1/00* (2006.01)
*H03M 1/36* (2006.01)

(52) U.S. Cl.
CPC ............... *H03M 1/74* (2013.01); *G01L 1/005* (2013.01); *H03M 1/36* (2013.01)

(58) Field of Classification Search
CPC .......... H03M 1/74; H03M 1/36; H03M 11/02; H03M 1/00; H03M 1/1071; G01L 1/005; G06F 3/03545; G06F 3/016; G06F 3/0383; G06F 3/0338; G06F 3/03543; G06F 3/041; G06F 3/044; A63F 13/06; A63F 13/24; A63F 13/218; A63F 13/22; A63F 2300/1018; A63F 2300/1043
USPC ........................................................ 341/34, 33
See application file for complete search history.

(56) References Cited

U.S. PATENT DOCUMENTS

| | | | | |
|---|---|---|---|---|
| 6,509,848 B1 * | 1/2003 | Ogata | ................ | G08C 23/04 200/515 |
| 6,885,364 B1 * | 4/2005 | Ogata | ................ | A63F 13/06 345/161 |
| 2003/0107547 A1 * | 6/2003 | Kehlstadt | ............ | G06F 3/03543 345/156 |
| 2003/0122779 A1 * | 7/2003 | Martin | .................. | G06F 1/1662 345/156 |
| 2004/0259638 A1 * | 12/2004 | Kramer | ................... | A63F 13/06 463/36 |
| 2006/0181517 A1 * | 8/2006 | Zadesky | ............... | G06F 1/1613 345/173 |

(Continued)

OTHER PUBLICATIONS

Force-sensing resistor—Wikipedia, https://en.wikipedia.org/wiki/Force-sensing_resistor, Mar. 15, 2019, 6 pages.

(Continued)

*Primary Examiner* — Linh V Nguyen
(74) *Attorney, Agent, or Firm* — Harness, Dickey & Pierce, P.L.C.; Anthony G. Fussner

(57) ABSTRACT

A membrane digital analog switch includes an input button surface adapted to receive an input pressure from a user, and a digital switch positioned below the input button surface to generate a digital switch activation signal when the received pressure on the input button surface is greater than or equal to a specified digital pressure threshold. The membrane digital analog switch also includes an analog switch adapted to generate an analog switch activation signal when the received pressure on the input button surface is greater than or equal to a specified analog pressure threshold. The specified analog pressure threshold is greater than the specified digital pressure threshold, the digital switch activation signal is a binary digital signal, and the analog switch activation signal is variable and corresponds to an analog sensed value of the received pressure on the input button surface.

20 Claims, 5 Drawing Sheets

(56) References Cited

U.S. PATENT DOCUMENTS

| | | | | |
|---|---|---|---|---|
| 2007/0188455 A1* | 8/2007 | O'Connell | ............ | G06F 3/0312 |
| | | | | 345/163 |
| 2008/0202824 A1* | 8/2008 | Philipp | .................... | G06F 3/02 |
| | | | | 178/18.01 |
| 2011/0044338 A1* | 2/2011 | Stahl | .................... | H04L 1/1607 |
| | | | | 370/392 |
| 2019/0291000 A1* | 9/2019 | Campbell | ........... | G06F 3/04883 |

OTHER PUBLICATIONS

Membrane Switches & Keypads—Design and Manufacture, https://butlertechnologies.com/products/membrane-switches-keypads/?_vsreidom=ppcgoogle&utm_source=google&utm_medium=cpc&utm_term=%2Bmembrane%20%2Bswitches&utm_campaign=Membrane%20Switches&gclid=CjwKCAjwmg3kBRB_ElwAJkNDpysCa5DIoFVMNF0wCNnz59NGK4UrNYmHEsgp4Nojw_9ZA60yOLUT_BoC7pQOAvD_BwE, Mar. 15, 2019, 16 pages.

Force Sensitive Resistor 0.5" SEN-09375—SparkFun Electronics, https://www.sparkfun.com/products/9375, Mar. 15, 2019, 11 pages.

\* cited by examiner

MEMBRANE DIGITAL ANALOG SWITCHES

FIELD

The present disclosure generally relates to membrane digital analog switches.

BACKGROUND

This section provides background information related to the present disclosure which is not necessarily prior art.

Keypads sometimes include membrane digital switches such as tactile switches including metal domes, non-tactile metal switches including conductive pads, etc. Separately, a force-sensing resistor includes a material whose resistance changes when a force, pressure, mechanical stress, etc., is applied.

DRAWINGS

The drawings described herein are for illustrative purposes only of selected embodiments and not all possible implementations, and are not intended to limit the scope of the present disclosure.

Corresponding reference numerals indicate corresponding (but not necessarily identical) parts throughout the several views of the drawings.

DETAILED DESCRIPTION

Figure 1:
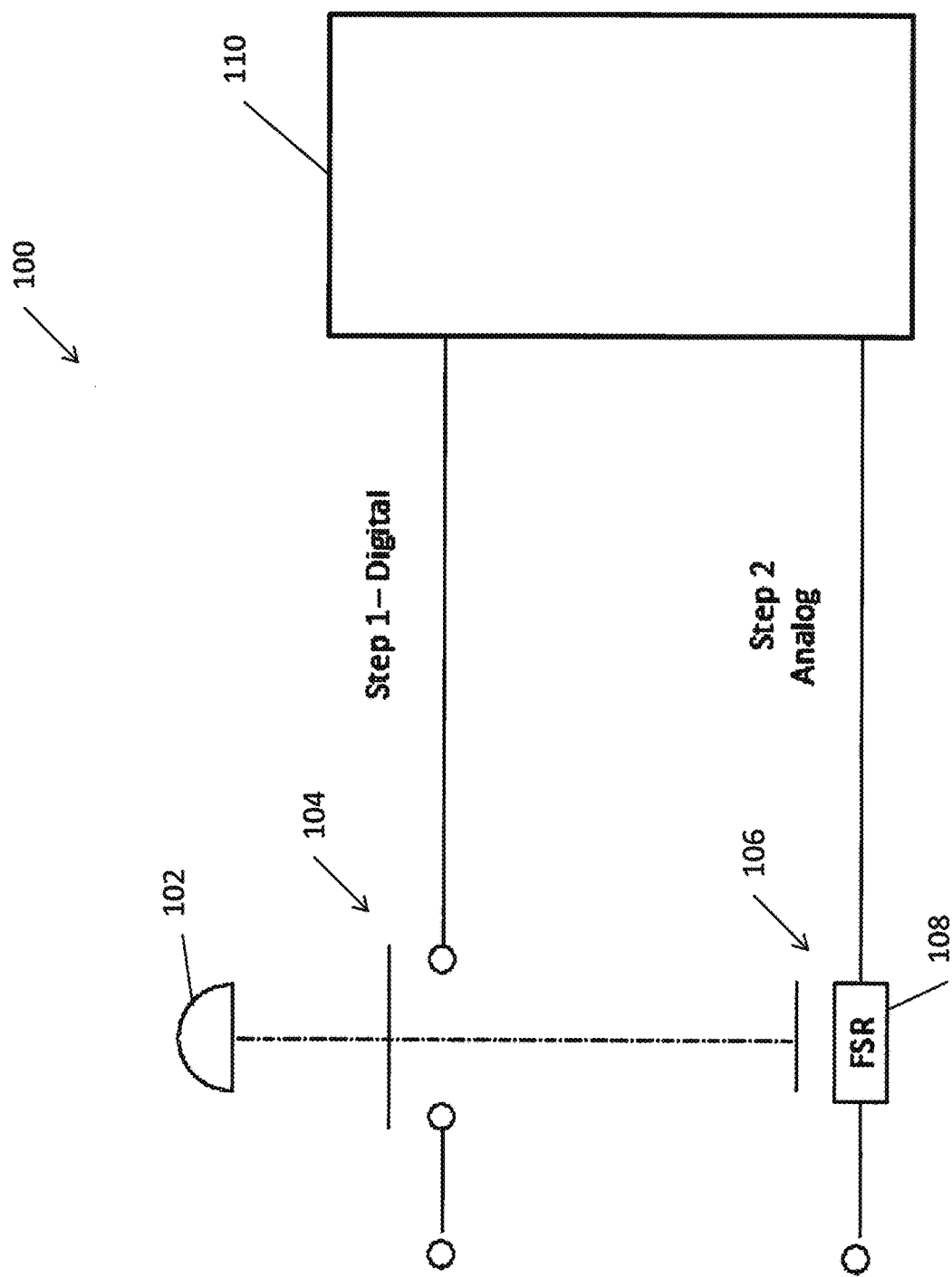
FIG. 1 is a block diagram of a membrane digital analog switch according to one example embodiment of the present disclosure.

Example embodiments will now be described more fully with reference to the accompanying drawings.

Disclosed herein are exemplary embodiments of membrane digital analog switches. A membrane digital analog switch may combine digital and analog switch functions in a single button where an initial press of the button generates a digital signal, and further pressure on the button adjusts an analog signal value corresponding to the input pressure.

These example membrane digital analog switches may be used in any suitable applications, such as applications where a positive on step is required before analog functionality is engaged, etc. Some example applications include a crane remote control for two speeds, three speeds, more than three speeds, etc., where the different speeds correspond to a current analog value of the membrane digital analog switch.

In some embodiments, a membrane digital analog switch may be used for a crane control where a crane has a stepless drive and input pressure (e.g., from a thumb, finger, etc.) controls a speed of the crane, or a machine control where a flow rate is proportional to input pressure (e.g., a concrete pump, a pressure washer, etc.). As another example, vehicle speed could be controlled according to input pressure (e.g., for a tracked vehicle, etc.).

The digital switch may include any suitable digital switch element capable of generating a digital activation signal (e.g., a binary on or off signal, etc.) in response to a user applying input pressure above a digital pressure threshold. For example, the digital switch may include a mechanical digital switch such as a cap switch, a rocker switch, a tactile switch (e.g., including a metal dome), a non-tactile switch (e.g., including an electrically-conductive pad), etc.

As the user increases pressure at or above the digital switch activation threshold, the analog switch element may output, sense, detect, etc., an analog signal switch activation signal that changes in response to changes in the input pressure. For example, the analog switch may include a force-sensing resistor whose resistance changes when a force, pressure, mechanical stress, etc. is applied. The changing resistance may be measured and used to control a speed or other suitable function of a crane, machine, vehicle, etc., according to the input pressure from the user.

In a rocker switch, an initial pressure could activate the digital switch, while further pressure in the same motion adjusts analog functionality of the analog switch. Similarly, a tactile switch may allow for initial digital signal activation followed by analog control in a same motion of applying pressure to the top of the tactile switch.

In some embodiments, the force-sensing resistor may have a non-linear characteristic, may have low repeatability, etc. The force-sensing resistor may have an initial high resistance and fall rapidly as pressure is initially increased, then change resistance more slowly as the pressure continues to increase. Accordingly, the force-sensing resistor of the analog switch element may be combined with the digital switch element in different optional arrangements.

For example, the analog force-sensing resistor may be connected in series with a second digital switch, so the starting point of user engagement of the analog switch force-sensing resistor is clear. When the digital switch closes, an initial resistance may be measured and the remaining resistance slope of the force-sensing resistor may be calibrated from the measured initial resistance.

As another example, a force-sensing resistor may be used directly for the analog switch (e.g., placed below the digital switch, etc.), and the resistance value of the force-sensing resistor may be measured substantially continuously. As the first digital switch closes the slope of the force-sensing resistor changes, and a controller, firmware, etc., may interpret the changing slope of resistance to determine a level of analog switch activation.

Combining a digital switch element and an analog switch element into a membrane design may reduce a cost of a keypad, reduce a complexity of the keypad, increase reliability, allow for a more compact physical package that takes up less space, etc. The keypad may have signal lines that are buried within power planes for greater electromagnetic immunity.

In some embodiments, membrane digital analog switches may include a Safe Design process to facilitate (e.g., ensure) Performance Level D by utilizing dual channel and time domain architecture. For example, redundancy may be used to reduce the likelihood of (e.g., prevent) a fault that takes down both channels, by taking measurements of first and second stages at different times (e.g., sequentially) and determining that the other stage is not currently activated.

In an example embodiment, a membrane digital analog switch includes an input button surface adapted to receive an input pressure from a user, and a digital switch positioned below the input button surface to generate a digital switch activation signal when the received pressure on the input button surface is greater than or equal to a specified digital pressure threshold.

The membrane digital analog switch also includes an analog switch adapted to generate an analog switch activation signal when the received pressure on the input button surface is greater than or equal to a specified analog pressure threshold. The specified analog pressure threshold is greater than the specified digital pressure threshold, the digital switch activation signal is a binary digital signal, and the analog switch activation signal is variable and corresponds to an analog sensed value of the received pressure on the input button surface.

The analog switch may include a force-sensing resistor, and the force-sensing resistor may have a non-linear resistance characteristic where a resistance of the force-sensing resistor decreases non-linearly as pressure on the input button surface is increased. The membrane digital analog switch may include a controller configured to measure the analog switch activation signal, and to determine the received input pressure on the input button surface according to the measured analog switch activation signal.

For example, the controller may be configured to determine a change in slope of the analog switch activation signal, and compare the change in slope to the non-linear resistance characteristic of the force-sensing resistor to determine the received input pressure on the input button surface.

In some embodiments, the analog switch including the force-sensing resistor is positioned below the digital switch with respect to the input button surface. The digital switch may be a first digital switch, and the membrane digital analog switch may further include a second digital switch positioned below the first digital switch with respect to the input button surface. The analog switch including the force-sensing resistor may be coupled in series with the second digital switch.

The controller may be configured to detect a second digital switch activation signal when the second digital switch is closed, and measure an initial resistance of the force-sensing resistor in response to detecting the second digital switch activation signal. The controller may set the measured initial resistance as a calibration value for measuring an analog force-sensing resistor signal corresponding to the resistance of the force-sensing resistor to determine the received input pressure on the input button surface.

In some embodiments, the input button surface and the digital switch define a tactile switch including a metal dome, and the input button surface includes an overlay contacting a first side of the metal dome. A second side of the metal dome opposite the first side is positioned to contact an electrical conductor of the digital switch in response to the received pressure on the overlay contacting the first side of the metal dome.

Alternatively, the input button surface and the digital switch may define a non-tactile switch including an electrically-conductive pad, where the input button surface includes an overlay contacting a first side of the electrically-conductive pad. A second side of the electrically-conductive pad opposite the first side is positioned to contact an electrical conductor of the digital switch in response to the received pressure on the overlay contacting the first side of the electrically-conductive pad.

The controller may be configured to determine a positive on step in response to receiving the digital switch activation signal, and in response to determining the positive on step, to implement one or more analog functions according to the received analog switch activation signal. For example, the one or more analog functions may include controlling a speed or flow rate of a machine, controlling the speed of a crane or a vehicle, controlling the flow rate of a concrete pump or a pressure washer, etc.

With reference to the figures, FIG. 1 illustrates an example membrane digital analog switch 100 according to some aspects of the present disclosure. The membrane digital analog switch 100 includes an input button surface 102 adapted to receive an input pressure from a user, and a digital switch 104 positioned below the input button surface 102 to generate a digital switch activation signal when the received pressure on the input button surface 102 is greater than or equal to a specified digital pressure threshold.

The membrane digital analog switch 100 also includes an analog switch 106 adapted to generate an analog switch activation signal when the received pressure on the input button surface 102 is greater than or equal to a specified analog pressure threshold. The specified analog pressure threshold is greater than the specified digital pressure threshold. The digital switch activation signal is a binary digital signal, and the analog switch activation signal is variable and corresponds to an analog sensed value of the received pressure on the input button surface 102.

The analog switch 106 includes a force-sensing resistor (FSR) 108. The force-sensing resistor 108 may have a non-linear resistance characteristic where a resistance of the force-sensing resistor 108 decreases non-linearly as pressure on the input button surface is increased.

For example, the force-sensing resistor 108 may include an electrically-conductive polymer, which changes resistance in a predictable manner following application of force to its surface. The force-sensing resistor 108 may include a polymer sheet or ink that can be applied by screen printing.

The sensing film may include both electrically conducting and non-conducting particles suspended in a matrix, and the particles may have sub-micrometre sizes. Applying a force to the surface of the sensing film causes the particles to touch the electrically conducting electrodes, which changes a resistance of the film. FSRs may have a thickness of less than 0.5 mm, etc., low cost, good shock resistance, etc. However, some FSRs may have low precision (e.g., measurements that may differ by 10% or more, etc.).

As shown in FIG. 1, the membrane digital analog switch 100 may include an optional controller 110 configured to measure the analog switch activation signal, and to determine the received input pressure on the input button surface according to the measured analog switch activation signal.

For example, the controller 110 may be configured to determine a change in slope of the analog switch activation signal, and compare the change in slope to the non-linear resistance characteristic of the force-sensing resistor to determine the received input pressure on the input button surface 102.

As shown in FIG. 1, the analog switch 106 including the force-sensing resistor 108 is positioned below the digital switch 104 with respect to the input button surface 102. For example, the input button surface 102 may receive an actuating force from the user, and may include a rubber membrane, a cover, etc. The digital switch 104 may include a C plus inner circle switch arrangement, a metal dome sitting on top of the C plus inner circle components, etc.

Figure 2:
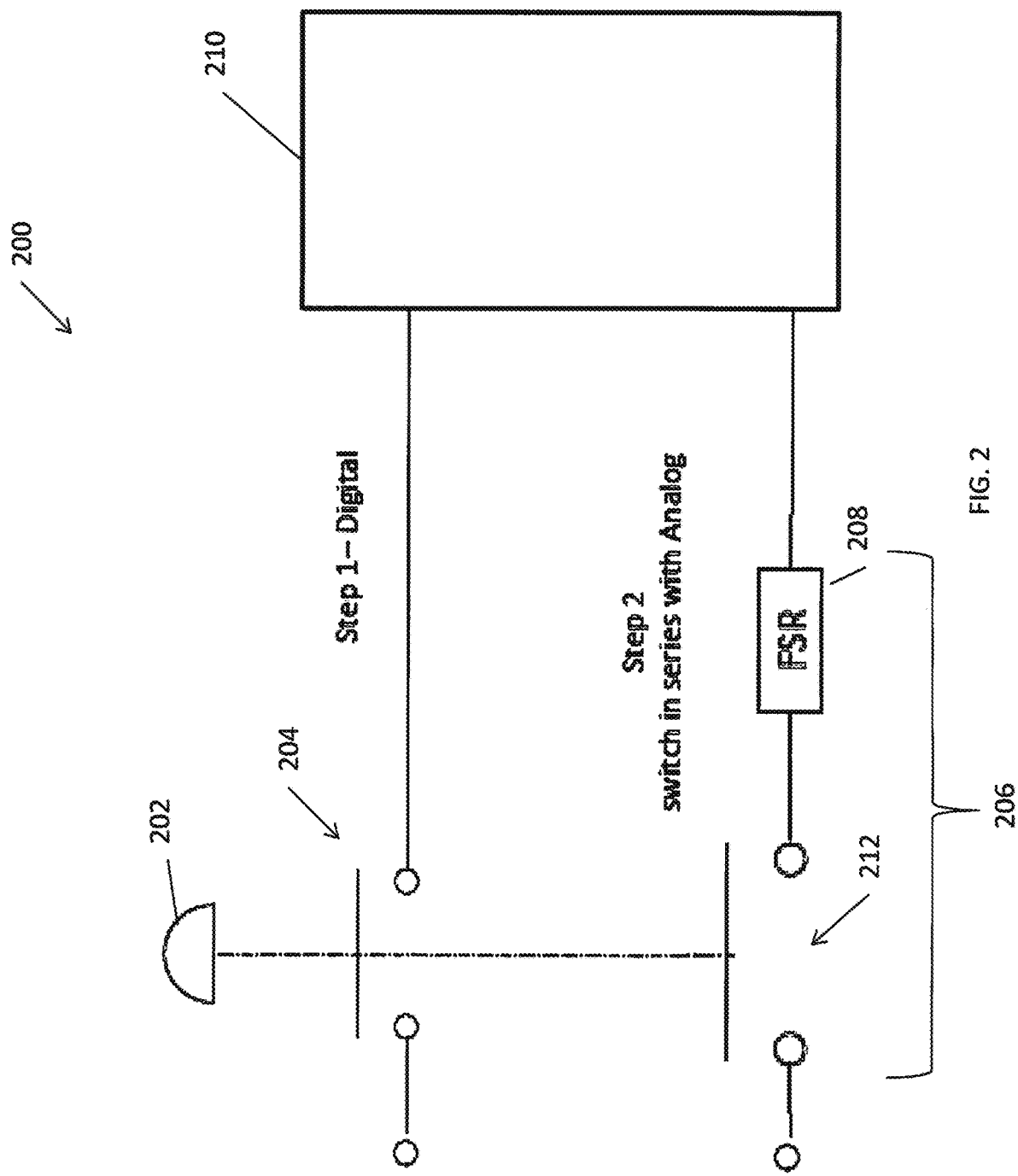
FIG. 2 is a block diagram of a membrane digital analog switch including a force-sensing resistor in series with a digital switch according to another example embodiment of the present disclosure.

In another embodiment, and as shown in FIG. 2, a digital switch may be a first digital switch 204, and a membrane digital analog switch 200 may further include a second digital switch 212 positioned below the first digital switch 204 with respect to the input button surface 202.

In the membrane digital analog switch 200 illustrated in FIG. 2, the analog switch 206 including the force-sensing resistor 208 is be coupled in series with the second digital switch 212. In this case, the optional controller 210 may be configured to detect a second digital switch activation signal when the second digital switch 212 is closed.

The controller 210 may measure an initial resistance of the force-sensing resistor 208 in response to detecting the second digital switch activation signal. The controller 210 may set the measured initial resistance as a calibration value for measuring an analog force-sensing resistor signal corresponding to the resistance of the force-sensing resistor 208 to determine the received input pressure on the input button surface 202.

For example, the force-sensing resistor 208 may have a non-linear characteristic, may have low repeatability, etc. The force-sensing resistor 208 may have an initial high resistance and fall rapidly as pressure is initially increased, then change resistance more slowly as the pressure continues to increase.

When the force-sensing resistor 208 is connected in series with the second digital switch 212 as shown in the example embodiment of FIG. 2, the starting point of user engagement of the force-sensing resistor 208 is clear. When the second digital switch 212 closes, an initial resistance may be measured and the remaining resistance slope of the force-sensing resistor 208 may be calibrated from the measured initial resistance.

The membrane digital analog switches 100 and 200 may be included in any suitable keypad, user input device, etc. For example, FIGS. 3 and 4 illustrated keypads 300 and 400 including the membrane digital analog switches 100 and 200, respectively.

Figure 3:
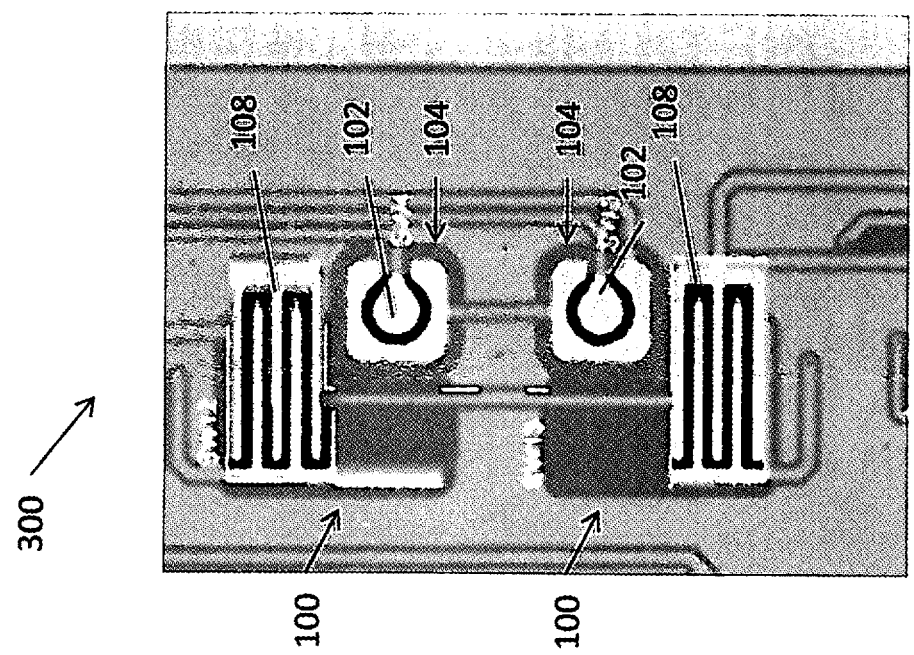
FIG. 3 is a top view of a keypad including two membrane digital analog switches as shown in FIG. 1.

As shown in FIG. 3, the keypad 300 includes two membrane digital analog switches 100, each including an input button surface 102. An initial pressure on the input button surface activates the digital switch 104, while further pressure on the input button surface 102 activates the analog switch by changing the resistance of the force-sensing resistor 108.

Figure 4:
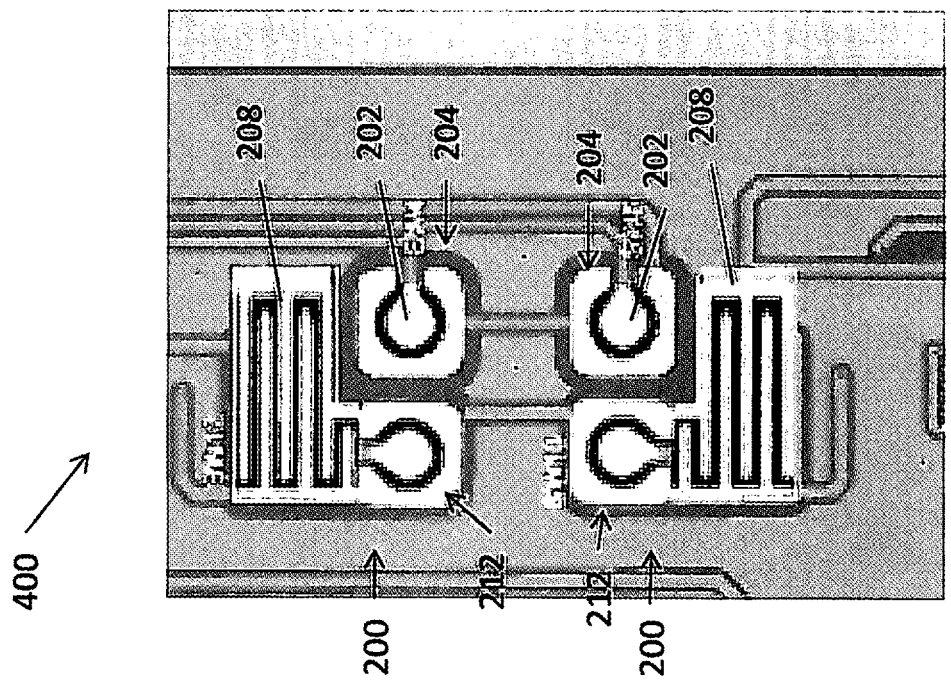
FIG. 4 is a top view of a keypad including two membrane digital analog switches as shown in FIG. 2.

FIG. 4 illustrates the keypad 400 as including two membrane digital analog switches 200, each including an input button surface 202. An initial pressure on the input button surface activates the first digital switch 204, while further pressure on the input button surface 202 activates the analog switch by first contacting the second digital switch 212, and then changing the resistance of the force-sensing resistor 208. The force-sensing resistor 208 is connected in series with the second digital switch 212.

Although FIGS. 3 and 4 illustrate keypads 300 and 400, other embodiments may include any suitable membrane switch arrangement, layout, etc. For example, the membrane digital analog switches may have a slim profile, a sealed outer layer (e.g., for inhibiting dust or water entry), etc. One or more flexible layers (e.g., polyester, etc.) may be stacked together and allow a user to press down on a top of the flexible layers to activate a button, etc.

Figure 5:
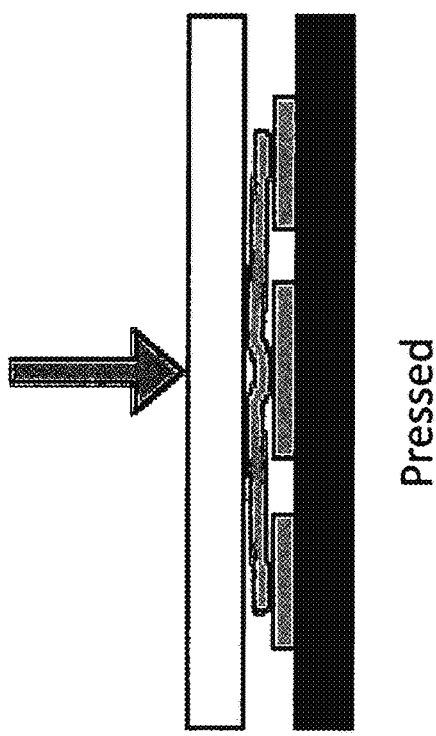
FIG. 5 is a cross-sectional view of a tactile switch according to another example embodiment of the present disclosure.
Figure 5:
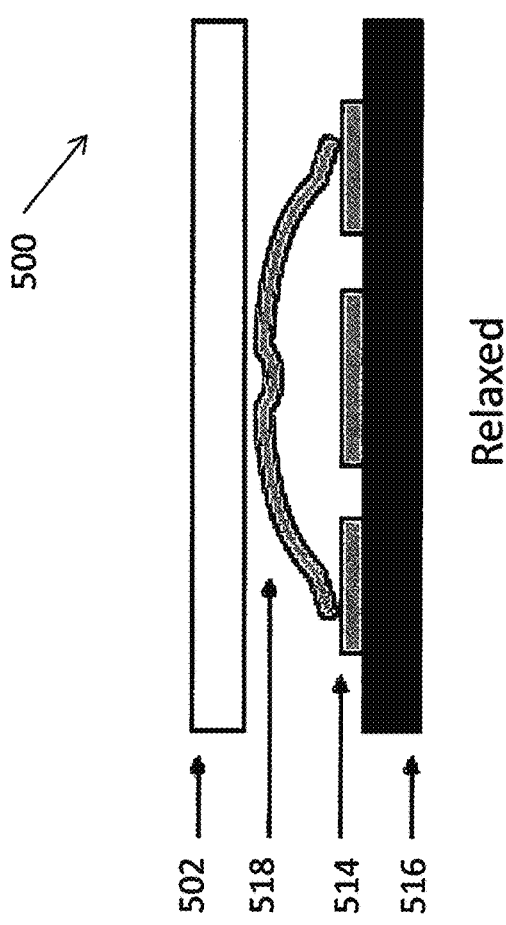

The membrane digital analog switches may include tactile switches, non-tactile switches, etc. For example, FIG. 5 illustrates a tactile switch 500 that includes an overlay 502 (e.g., an input button surface). An electrically-conductive track 514 is positioned on a circuit substrate 516.

A metal dome 518 is positioned between the overlay 502 and the electrically-conductive track 514. When a user presses down on the overlay 502, the metal dome 518 collapses to contact the electrically-conductive track 514. A circuit is closed via the contact between the metal dome 518 and the electrically-conductive track 514, which may generate a digital activation signal, etc.

A user may be able to feel the collapsing of the metal dome 518 to provide tactile feedback, and when a user release pressure the metal dome 518 may pop up back to the original position. A force-sensing resistor may be placed below the metal dome 518, below the electrically-conductive track 514, below the substrate 516, etc.

Figure 6:
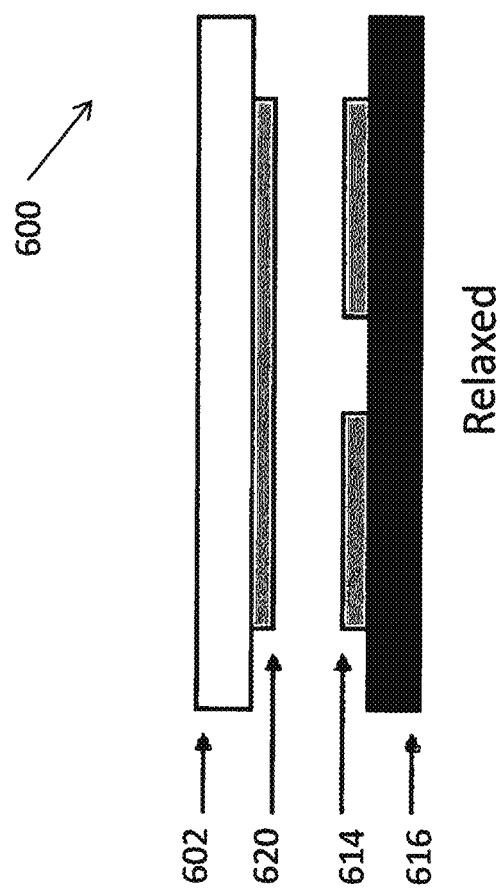
FIG. 6 is a cross-sectional view of a non-tactile switch according to another example embodiment of the present disclosure.

A non-tactile switch 600 is illustrated in FIG. 6. The non-tactile switch 600 includes an overlay 602, and an electrically-conductive track 614 positioned on a substrate 616. An electrically-conductive pad 620 is positioned between the overlay 602 and the electrically-conductive track 614. When a user presses down on the overlay 602, the electrically-conductive pad 620 contacts the electrically-conductive track 614. A circuit is closed via the contact between the electrically-conductive pad 620 and the electrically-conductive track 614, which may generate a digital activation signal, etc.

As compared to the tactile switch 500 illustrated in FIG. 5, the non-tactile switch 600 illustrated in FIG. 6 may not provide tactile feedback to the user when the switch 600 is closed, because the switch 600 does not include a collapsing metal dome, etc. A force-sensing resistor may be placed below the electrically-conductive pad 620, below the electrically-conductive track 614, below the substrate 616, etc.

As described herein, the example controllers may include a microprocessor, microcontroller, integrated circuit, digital signal processor, etc., which may include memory. The controllers may be configured to perform (e.g., operable to perform, etc.) any of the example processes described herein using any suitable hardware and/or software implementation. For example, the controllers may execute computer-executable instructions stored in a memory, may include one or more logic gates, control circuitry, etc.

According to another example embodiment, a method of operating a membrane digital analog switch including an input button surface, a digital switch and an analog switch is disclosed. The method includes receiving, at the input button surface, an input pressure from a user.

The method also includes generating, by the digital switch, a digital switch activation signal when the received pressure on the input button surface is greater than or equal to a specified digital pressure threshold, and generating, by the analog switch, an analog switch activation signal when the received pressure on the input button surface is greater than or equal to a specified analog pressure threshold.

The specified analog pressure threshold is greater than the specified digital analog pressure threshold, the digital switch activation signal is a binary digital signal, and the analog switch activation signal is variable and corresponds to an analog sensed value of the received pressure on the input button surface.

The method may include implementing one or more analog functions of a machine according to the analog switch activation signal, only after the digital switch activation signal is generated. In some embodiments, the analog switch includes a force-sensing resistor, and the analog switch is positioned below the digital switch with respect to the input button surface.

The digital switch may be a first digital switch, with a second digital switch positioned below the first digital switch with respect to the input button surface. The analog switch may include a force-sensing resistor, and the analog switch including the force-sensing resistor may be coupled in series with the second digital switch.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purposes of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

The terminology used herein is for the purpose of describing particular example embodiments only and is not intended to be limiting. For example, when permissive phrases, such as "may comprise", "may include", and the like, are used herein, at least one embodiment comprises or includes the feature(s). As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A membrane digital analog switch comprising:
   an input button surface adapted to receive an input pressure from a user;
   a digital switch positioned below the input button surface to generate a digital switch activation signal when the received pressure on the input button surface is greater than or equal to a specified digital pressure threshold; and
   an analog switch adapted to generate an analog switch activation signal when the received pressure on the input button surface is greater than or equal to a specified analog pressure threshold;
   wherein the specified analog pressure threshold is greater than the specified digital pressure threshold, the digital switch activation signal is a binary digital signal, and the analog switch activation signal is variable and corresponds to an analog sensed value of the received pressure on the input button surface.

2. The membrane digital analog switch of claim 1, wherein the analog switch includes a force-sensing resistor.

3. The membrane digital analog switch of claim 2, wherein the force-sensing resistor includes a non-linear resistance characteristic where a resistance of the force-sensing resistor decreases non-linearly as pressure on the input button surface is increased.

4. The membrane digital analog switch of claim 3, further comprising a controller configured to measure the analog switch activation signal, and to determine the received input pressure on the input button surface according to the measured analog switch activation signal.

5. The membrane digital analog switch of claim 4, wherein the controller is configured to determine a change in slope of the analog switch activation signal, and compare the change in slope to the non-linear resistance characteristic of the force-sensing resistor to determine the received input pressure on the input button surface.

6. The membrane digital analog switch of claim 2, wherein the analog switch including the force-sensing resistor is positioned below the digital switch with respect to the input button surface.

7. The membrane digital analog switch of claim 2, wherein the digital switch is a first digital switch, the membrane digital analog switch further comprising a second digital switch positioned below the first digital switch with respect to the input button surface, and wherein the analog switch including the force-sensing resistor is coupled in series with the second digital switch.

8. The membrane digital analog switch of claim 7, further comprising a controller configured to:
 detect a second digital switch activation signal when the second digital switch is closed;
 measure an initial resistance of the force-sensing resistor in response to detecting the second digital switch activation signal; and
 set the measured initial resistance as a calibration value for measuring an analog force-sensing resistor signal corresponding to the resistance of the force-sensing resistor to determine the received input pressure on the input button surface.

9. The membrane digital analog switch of claim 1, wherein:
 the input button surface and the digital switch define a tactile switch including a metal dome;
 the input button surface comprises an overlay contacting a first side of the metal dome; and
 a second side of the metal dome opposite the first side is positioned to contact an electrical conductor of the digital switch in response to the received pressure on the overlay contacting the first side of the metal dome.

10. The membrane digital analog switch of claim 1, wherein:
 the input button surface and the digital switch define a non-tactile switch including an electrically-conductive pad;
 the input button surface comprises an overlay contacting a first side of the electrically-conductive pad; and
 a second side of the electrically-conductive pad opposite the first side is positioned to contact an electrical conductor of the digital switch in response to the received pressure on the overlay contacting the first side of the electrically-conductive pad.

11. The membrane digital analog switch of claim 1, wherein the input button surface and the digital switch define a rocker switch.

12. The membrane digital analog switch of claim 1, further comprising a controller configured to:
 determine a positive on step in response to receiving the digital switch activation signal; and
 in response to determining the positive on step, to implement one or more analog functions according to the received analog switch activation signal.

13. The membrane digital analog switch of claim 12, wherein the one or more analog functions include controlling a speed or flow rate of a machine.

14. The membrane digital analog switch of claim 13, wherein the one or more analog functions include controlling the speed of a crane or a vehicle.

15. The membrane digital analog switch of claim 14, wherein the one or more analog function include controlling the flow rate of a concrete pump or a pressure washer.

16. A keypad including the membrane digital analog switch of claim 1.

17. A method of operating a membrane digital analog switch including an input button surface, a digital switch, and an analog switch, the method comprising:
 receiving, at the input button surface, an input pressure from a user;
 generating, by the digital switch, a digital switch activation signal when the received pressure on the input button surface is greater than or equal to a specified digital pressure threshold; and
 generating, by the analog switch, an analog switch activation signal when the received pressure on the input button surface is greater than or equal to a specified analog pressure threshold;
 wherein the specified analog pressure threshold is greater than the specified digital analog pressure threshold, the digital switch activation signal is a binary digital signal, and the analog switch activation signal is variable and corresponds to an analog sensed value of the received pressure on the input button surface.

18. The method of claim 17, further comprising implementing one or more analog functions of a machine according to the analog switch activation signal, only after the digital switch activation signal is generated.

19. The method of claim 18, wherein the analog switch includes a force-sensing resistor, and the analog switch is positioned below the digital switch with respect to the input button surface.

20. The method of claim 19, wherein the digital switch is a first digital switch, a second digital switch is positioned below the first digital switch with respect to the input button surface, the analog switch includes a force-sensing resistor, and the analog switch including the force-sensing resistor is coupled in series with the second digital switch.

* * * * *